United States Patent [19]
Vicari

[11] Patent Number: 5,462,840
[45] Date of Patent: Oct. 31, 1995

[54] USE OF POLY(35-DISUBSTITUTED 4-HYDROXYSTYRENE/N-SUBSTITUTED MALEIMIDE FOR FORMING A NEGATIVE IMAGE

[75] Inventor: Richard Vicari, Corpus Christi, Tex.

[73] Assignee: Hoechst Celanese Corporation, Somerville, N.J.

[21] Appl. No.: 673,243

[22] Filed: Mar. 19, 1991

Related U.S. Application Data

[63] Continuation of Ser. No. 506,508, Apr. 9, 1990, abandoned, which is a continuation of Ser. No. 97,810, Sep. 16, 1987, abandoned.

[51] Int. Cl.$^6$ .................... G03F 7/30; G03F 7/40
[52] U.S. Cl. ............ 430/326; 430/191; 430/192; 430/330; 430/909
[58] Field of Search ................... 430/326, 325, 430/330, 191, 192, 909

[56] References Cited

U.S. PATENT DOCUMENTS

| | | | |
|---|---|---|---|
| 2,276,138 | 3/1942 | Alderman et al. | 260/85 |
| 3,963,662 | 6/1976 | Fujiwara et al. | 260/29.6 WB |
| 3,964,908 | 6/1976 | Bargon et al. | 204/159.11 |
| 3,970,534 | 7/1976 | Fujiwara et al. | 204/159.17 |
| 4,100,140 | 7/1978 | Zahir et al. | 526/90 |
| 4,144,063 | 3/1979 | Haas | 96/29 D |
| 4,221,700 | 9/1980 | Minagawa et al. | 260/45.7 PH |
| 4,298,720 | 11/1981 | Yamazaki et al. | 526/262 |
| 4,388,451 | 6/1983 | Culbertson et al. | 526/271 |
| 4,451,676 | 5/1984 | Everly | 561/780 |
| 4,544,704 | 10/1985 | Hefner | 528/108 |
| 4,565,846 | 1/1986 | Saito et al. | 525/101 |
| 4,581,321 | 4/1986 | Stahlhofen | 430/330 |
| 4,600,683 | 7/1986 | Greco et al. | 430/270 |
| 4,663,268 | 5/1987 | Turner et al. | 430/270 |
| 4,684,597 | 8/1987 | Lussier | 430/190 |
| 4,931,381 | 6/1990 | Spak et al. | 430/330 |

FOREIGN PATENT DOCUMENTS

| | | |
|---|---|---|
| 140273 | 5/1985 | European Pat. Off. . |
| 187517 | 7/1986 | European Pat. Off. . |

OTHER PUBLICATIONS

Jones,. J. A. et al *Journal of Polymer Chemistry*, vol. 24 pp. 1487–1595 1986.

Carson, B. B. et al "Preparation of Vinyl Phenols and Isopropenyl Phenols", Apr. 1958.

Arshady, R. et al *Journal of Polymer Science*, vol. 12 1974.

Packham, D. I. "Chelatins, Polymer Derived for Poly(4-hydroxystyrane)".

Turner S. R. et al. *Polymer Eng & Science*, "High–Tg Base–Soluble Copolymer as Novolak Replacement for Positive Photoresists" Sep. 1986 pp. 1086–1100.

Turner S. R. et al *Polymer Nat'l Science and Eng* Thermally Stable Deep U.V. Resist Materials 1986 pp. 608–610.

Condensed Chemical Dictionary, 5th ed. 1956, p. 37 Reinhold Pub. Corp. NY.

English Abstract of Japanese Publication #62–038,448, published Feb. 19, 1987 (Spak et al.).

Jones, J. A. and Ottenbrite, R. M.; Journal of Polymer Chemistry vol. 24, pp. 1487–1595 (1986)–"Preparation and Structural Characterization of Poly(4–vinylphenylacetate–co–maleic anhydride".

Arshady, R. and Kenner, G. W., Journal of Polymer Science vol. 12, (pp. 2017–2025) 1974; "Phenolic Resins for Solid–Phase Synthesis: Copolymerization of Styrene and p–acetoxystyrene".

*Primary Examiner*—John S. Y. Chu
*Attorney, Agent, or Firm*—James J. Mullen; Donald R. Cassady; James L. McGinnis

[57] ABSTRACT

A compound, method of manufacture and method for use of an alternating copolymer having the structure

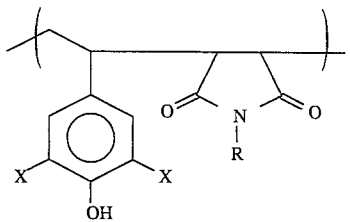

wherein X is independently H, $C_1$ to $C_{10}$ alkyl or alkoxy, primary or secondary amino or halogen, and R is aliphatic, cycloaliphatic, or aliphatic heterocyclic, and wherein the molecular weight ranges from about 1,000 to 50,000.

4 Claims, No Drawings

USE OF POLY(35-DISUBSTITUTED 4-HYDROXYSTYRENE/N-SUBSTITUTED MALEIMIDE FOR FORMING A NEGATIVE IMAGE

This is a continuation of application Ser. No. 07/506,508, filed on Apr. 9, 1990, now abandoned, which continuation of application Ser. No. 07/097,810, filed on Sep. 16, 1987, abandoned.

BACKGROUND OF THE INVENTION

The present invention relates to novel polymers which are poly(4-hydroxystyrene/N-substituted maleimides) as well as a process for the production and use thereof. This polymer has been found to be useful in the preparation of various compositions such as adhesives and coatings, as well as binder resins for photoresists. These polymers have the empirical formula

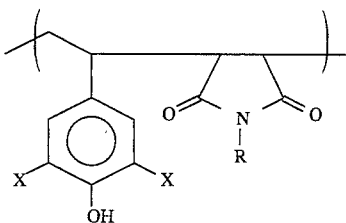

wherein X is independently H, $C_1$ to $C_{10}$ alkyl or alkoxy, amino or halogen, and R is aliphatic, cycloaliphatic, or aliphatic heterocyclic, and wherein the molecular weight ranges from about 1,000 to 50,000.

It is known in the art, according to U.S. Pat. No. 4,663,268, to produce substituted maleimide copolymers similar to those described above but wherein the R group is aryl. This patent teaches the usefulness of the aryl substituted materials as high temperature resistant binders for photoresists. Binder resins for photoresists must have many specialized properties. For example they must be water insoluble, yet soluble in aqueous alkaline solutions. They must be able to withstand the processing steps for integrated circuit production and must not interfere with the photosensitive characteristics of the o-quinone diazide photo-sensitizers with which the binder is usually admixed. U.S. Pat. Nos. 4,298,720 and 4,100,140 describe certain bismaleimides. U.S. Pat. No. 4,663,268 and EP 0 187 517 describe certain maleimides having N-aryl substitution. EP 0 140 273 describes photoresists employing certain maleimide containing copolymers. Japanese patents 79016995; 61218607 and 54101200 describe copolymers of vinyl phenols and maleic acid anhydride. U.S. Pat. No. 4,525,536 describes copolymers of aromatic maleimides, maleimides and vinyl aromatic monomers.

It is desired in the art to provide binder resins for photoresists which have a high glass transition temperature (Tg) so that etch-resistance is enhanced. While polymers of high Tg are certainly known, most cannot be used for photoresists due to disadvantageous side properties.

It is well known in the art to produce positive photoresist formulations such as those described in U.S. Pat. Nos. 3,666,475, 4,115,128 and 4,173,470. These include alkali-soluble phenol-formaldehyde novolak resins together with light-sensitive materials, usually a substituted naphthoquinone diazide compound. The resins and sensitizers are dissolved in an organic solvent or mixture of solvents and are applied as a thin film or coating to a substrate suitable for the particular application desired. Polyvinyl phenols are taught in U.S. Pat. Nos. 3,869,292 and 4,439,516.

The resin component of these photoresist formulations is soluble in aqueous alkaline solutions, but the naphthoquinone sensitizer acts as a dissolution rate inhibitor with respect to the resin. Upon exposure of selected areas of the coated substrate to actinic radiation, however, the sensitizer undergoes a radiation induced structural transformation and the exposed areas of the coating are rendered more soluble that the unexposed areas. This difference in solubility rates causes the exposed areas of the photoresist coating to be dissolved when the substrate is immersed in an alkaline developing solution while the unexposed areas are largely unaffected, thus producing a positive relief pattern on the substrate.

In most instances, the exposed and developed substrate will be subjected to treatment by a substrate-etchant solution. The photoresist coating protects the coated areas of the substrate from the etchant and thus the etchant is only able to etch the uncoated areas of the substrate, which in the case of a positive photoresist, correspond to the areas that were exposed to actinic radiation. Thus, an etched pattern can be created on the substrate which corresponds to the pattern on the mask, stencil, template, etc., that was used to create selective exposure patterns on the coated substate prior to development.

The relief pattern of the photoresist on the substrate produced by the method described above is useful for various applications including as an exposure mask or a pattern such as is employed in the manufacture of miniaturized integrated electronic components.

The properties of a photoresist composition which are important in commercial practice include the photospeed of the resist, development contrast, resist resolution, and resist adhesion.

Resist resolution refers to the capacity of a resist system to reproduce the smallest equally spaced line pairs and intervening spaces of a mask which is utilized during exposure with a high degree of image edge acuity in the developed exposed spaces.

In many industrial applications, particularly in the manufacture of miniaturized electronic components, a photoresist is required to provide a high degree of resolution for very small line and space widths (on the order of one micron or less).

The ability of a resist to reproduce very small dimension, on the order of a micron or less, is extremely important in the production of large scale integrated circuits on silicon chips and similar components. Circuit density on such a chip can only be increased, assuming photolithography techniques are utilized, by increasing the resolution capabilities of the resist.

Photoresists are generally categorized as being either positive working or negative working. In a negative working resist composition, the imagewise light struck areas harden and form the image areas of the resist after removal of the unexposed areas with a developer. In a positive working resist the exposed areas are the non-image areas. The light struck parts are rendered soluble in aqueous alkali developers. While negative resists are the most widely used for industrial production of printed circuit boards, positive resists are capable of much finer resolution and smaller imaging geometries. Hence positive resists are the choice for the manufacture of densely packed integrated circuits.

Hence the invention provides novel polymers and photographic compositions employing these polymers. In one important aspect of the invention, it has been found that photoresists which employ the aforesaid polymer as a binder resin show comparable development and dissolution properties to phenol formaldehyde novolak resins but an advantageously lower dissolution rate than polyvinyl phenols which are also known for this purpose. Polyvinyl phenols have the disadvantage of faster dissolution, which makes image differentiation more difficult to attain. However, they are capable of withstanding much higher processing temperatures, on the order of about 200° C., than the novolaks. The poly (4-hydroxy-styrene/N-substituted maleimides) of this invention demonstrate a dissolution rate comparable to the novolaks and can withstand processing temperature comparable to the polyvinyl phenols.

In addition, these resins have an exceptionally low u.v absorptivity in the spectrum range conventionally used to expose photoesists. They are essentially non-absorbing at 300 nm and above, and have an extremely low absorptivity in the 254–270 nm range. Thus these resins are advantageous for resists exposed in the u.v. and especially in the deep u.v. part of the spectrum. This is in contrast to N-aryl substituted maleimides which disadvantageously absorb u.v. radiation in the 256–270 nm range.

SUMMARY OF THE INVENTION

The invention provides an alternating copolymer having the structure

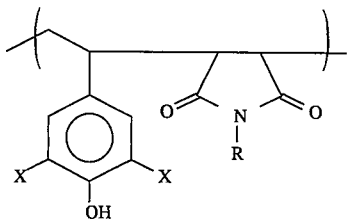

wherein X is independently H, $C_1$ to $C_{10}$ alkyl or alkoxy, primary or secondary amino or halogen, and R is aliphatic, cycloaliphatic, or aliphatic hetero-cyclic, and wherein the molecular weight ranges from about 1,000 to 50,000.

The invention also provides a method for preparing an alternating copolymer of the formula

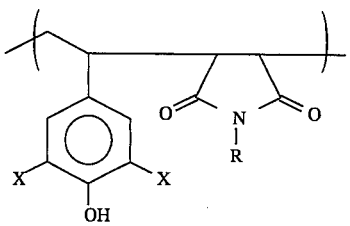

having a molecular weight in the range of from about 1,000 to about 50,000 which comprises reacting a acetoxystyrene having an X substituent at the 3,5 positions, with maleic anhydride in the presence of a free radical initiator, to form a pre-polymer and then reacting said pre-polymer with an aliphatic cycloaliphatic or non-aryl heterocyclic, primary amine, wherein X is independently H, $C_1$ to $C_{10}$ alkyl or alkoxy, primary or secondary amino or halogen and wherein R is aliphatic, cycloaliphatic or aliphatic heterocyclic.

Another aspect of the invention provides a photosensitive copolymer having the structure

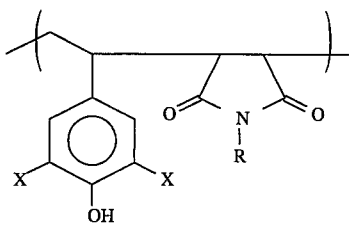

wherein X is independently H, $C_1$ to $C_{10}$ alkyl or alkoxy, amino or halogen, and R is aliphatic, cycloaliphatic, or aliphatic heterocyclic, and wherein the molecular weight ranges from about 1,000 to 50,000; and an o-quinone diazide photosensitizer, and a suitable solvent; wherein said copolymer is present in sufficient amount to serve as a binder for the composition, and said diazide is present in sufficient amount to provide image differentiation when the composition is coated on a substrate and imagewise exposed to actinic radiation; and said solvent is present in sufficient amount to form a homogeneous solution of the composition components.

In still another aspect of the invention there is provided a process for forming a photographic image which comprises coating the photographic composition above on a substrate, drying the composition until it is substantially non-tacky; imagewise exposing the composition to sufficient actinic, electron beam or x-ray radiation to provide an imagewise differentiation, and removing the non-image portions of said composition with a suitable developer.

DETAILED DESCRIPTION OF THE PREFERRED EMBODIMENT

In the process for the preparation of the foregoing copolymer, one begins by reacting a substituted or unsubstituted vinyl phenol with maleic anhydride in the presence of a free radical initiator. In the preferred embodiment the reactant is unsubstituted vinyl phenol. If a 3,5 substituted end product copolymer is desired, one begins with the corresponding 3,5 substituted vinyl phenol. The substituents are independently alkyl, alkoxy, primary or secondary amino or halogen. Preferred substituted components are $C_1$ to $C_{10}$, more preferably $C_1$ to $C_7$ alkyl or alkoxy groups. One preferred free radical initiator is azo isobutyronitrile. Other azo type initiators are also suitable. Other initiators non-exclusively include peroxides such as benzoyl peroxide, and di-butyl peroxide. It is predicted that essentially any free radical initiator will serve the same function. The foregoing prepolymer is then reacted with an aliphatic, cycloliphatic or aliphatic heterocyclic primary amine. Aryl amines may find use in some contexts but such are not preferred for this invention for the aforestated reasons. The copolymer has a molecular weight in the range of from about 1,000 to about 50,000 or more preferably about 5,000 to about 15,000. A typical reaction sequence would be:

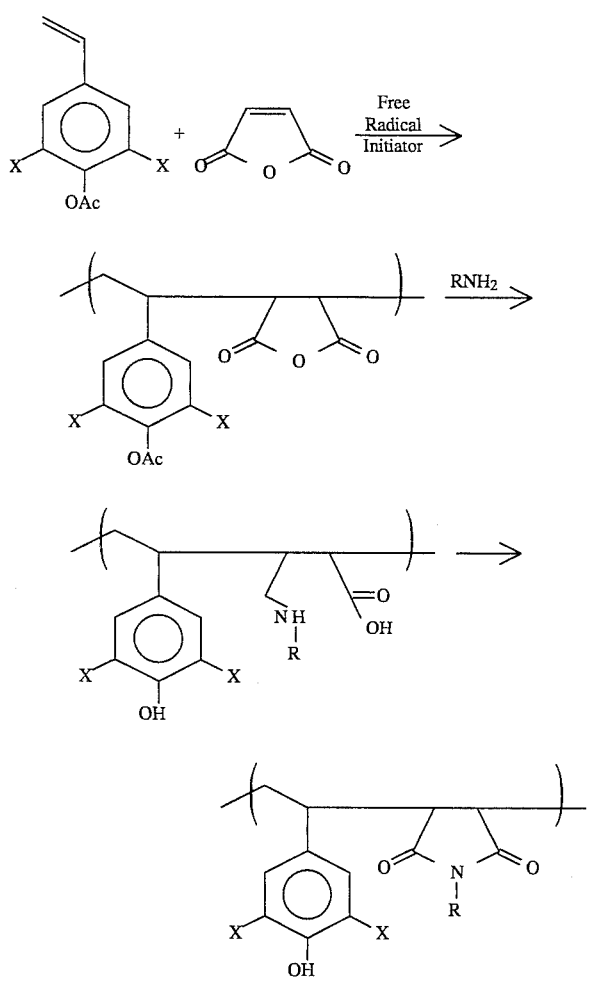

and X and R are as defined above.

One may optionally make other substitutions such as an acetoxy group for the hydroxy group on the starting phenol.

In the production of the photosensitive composition and photographic element of this invention, one blends the above produced copolymer binding resin with an o-quinone diazide photosensitizer and a suitable solvent until a homogeneous solution is formed. The solution is then coated on a suitable substrate and dried until it is non-tacky.

The use of o-quinone diazides is well known to the skilled artisan as demonstrated by *Light Sensitive Systems*, Kosar, J.; John Wiley & Sons, New York, 1965 in Chapter 7.4 which is also incorporated herein by reference. These sensitizers which comprise a component of the present resist compositions of the present invention are preferably selected from the group of substituted naphthoquinone diazide sensitizers which are conventionally used in the art in photoresist formulations. Such sensitizing compounds are disclosed, for example, in U.S. Pat. Nos. 2,797,213; 3,106,465; 3,148,983; 3,130,047; 3,201,329; 3,785,825; and 3,802,885, which are incorporated herein by reference.

The photosensitizer is preferably a 1,2 quinone diazide-4 or 5-sulfonic acid ester of a phenolic derivative. It presently appears that the number of fused rings is not important for this invention but the position of the sulfonyl group is important. That is, one may use benzoquinones, naphthoquinones or anthroquinones as long as the oxygen is in the 1 position, diazo is in the 2 position and the sulfonyl group is in the 4 or 5 position. Likewise the phenolic member to which it is attached does not appear to be important. For example it can be a cumylphenol derivative as taught in U.S. Pat. Nos. 3,640,992 or it can be a mono-, di-, or trihydroxyphenyl alkyl ketone or benzophenone as shown in U.S. Pat. Nos. 4,499,171. Both of these patents are incorporated herein by reference.

Useful photosensitizers include (1,2)naphthoquinonediazide-4-sulfonyl chloride, condensed with phenolic compounds such as hydroxy benzophenones especially trihydroxybenzophenone and more particularly 2,3,4-trihydroxybenzophenone; 2,3,4-trihydroxyphenyl pentyl ketone 1,2-naphthaquinone-2-diazide-4-sulfonic acid trisester or other alkylphenones; 2,3,4-trihydroxy-3'-methoxy benzophenone 1,2-napthaquinone-2-diazide-4-sulfonic acid trisester; 2,3,4-trihydroxy-3'-methyl benzophenone 1,2-naphthaquinone-2-diazide-4-sulfonic acid trisester; and 2,3,4-trihydroxy-benzophenone 1,2-naphthaquinone diazide-4-sulfonic acid trisester.

The photosensitive composition is formed by blending the ingredients in a suitable solvent composition. In the preferred embodiment the resin is preferably present in the overall composition in an amount of from about 75% to about 99% based on the weight of the solid; i.e. non-solvent parts of the composition. A more preferred range of resin would be from about 80% to about 90% and most preferably from about 82% to about 85% by weight of the solid composition parts. The diazide is preferably present in an amount ranging from about 1% to about 25% based on the weight of the solid, i.e., non-solvent parts of the composition. A more preferred range of the diazide would be from about 1% to about 20% and more preferably from about 10% to about 18% by weight of the solid composition parts.

In manufacturing the composition the resin and diazide are mixed with such solvents as the propylene glycol alkyl ether acetate, butyl acetate, xylene, ethylene glycol, monoethyl ether acetate, propylene glycol monomethyl ether and propylene glycol monomethyl ether acetate.

Additives such as colorants, dyes, anti-striation agents, plasticizers, adhesion promoters, speed enhancers, solvents and such surfactants as non-ionic surfactants may be added to the solution of resin, sensitizer and solvent before the solution is coated onto a substrate.

Examples of dye additives that may be used together with the photoresist compositions of the present invention include Methyl Violet 2B (C.I. No. 42535), Crystal Violet (C.I. 42555), Malachite Green (C.I. No. 42000), Victoria Blue B (C.I. No. 44045) and Neutral Red (C.I. No. 50040) at one to ten percent weight levels, based on the combined weight of resin and sensitizer. The dye additives help provide increased resolution by inhibiting back scattering of light off the substrate.

Anti-striation agents may be used up to a five percent weight level, based on the combined weight of resin and sensitizer.

Plasticizers which may be used include, for example, phosphoric acid tri-(beta-chloroethyl)-ester; stearic acid; dicamphor; polypropylene; acetal resins; phenoxy resins; and alkyl resins at one to ten percent weight levels based on the combined weight of resin and sensitizer. The plasticizer additives improve the coating properties of the material and enable the application of a film that is smooth and of uniform thickness.

Adhesion promoters which may be used include, for example, beta-(3,4-epoxy-cyclohexyl)-ethyltrimethoxysilane; p-methyl-disilane-methyl methacrylate; vinyltrichlorosilane; and gamma-amino-propyl triethoxysilane up to a 4 percent weight level, based on the combined weight of resin and sensitizer.

Development speed enhancers that may be used include, for example, picric acid, nicotinic acid or nitrocinnamic acid at a weight level of up to 20 percent, based on the combined weight of resin and sensitizer. These enhancers tend to increase the solubility of the photoresist coating in both the exposed and unexposed areas, and thus they are used in applications when speed of development is the overriding consideration even though some degree of contrast may be sacrificed. That is, while the exposed areas of the photoresist coating will be dissolved more quickly by the developer, the speed enhancers will also cause a larger loss of photoresist coating from the unexposed areas.

Free radical initiators such as di (trichloromethyl) stibenyl triazine and 1,1,1-trichloro-t-butyl acetophenone generate acid functionality upon exposure. They can therefore enhance exposure plus provide free radicals for cross-linking the image when baking afterward.

Non-ionic surfactants that may be used in the solution containing the light-sensitive composition of this invention include, for example, nonylphenoxy poly (oxyethylene) ethanol; octylphenoxy poly(oxyethylene) ethanol; and dinonyl phenoxy poly (oxyethylene) ethanol at up to 10 percent weight levels, based on the combined weight of resin and sensitizer.

The prepared photosensitive solution can be applied to a substrate to form a photoresist by any conventional method used in the photoresist art, including dipping, spraying, whirling and spin coating. When spin coating, for example, the resist solution can be adjusted as to the percentage of solids content in order to provide coating of the desired thickness given the type of spinning equipment utilized and the amount of time allowed for the spinning process.

The support for preparing the photoresist of this invention may be any suitable support such as a metal which may be electrochemically or mechanically roughened, such as aluminum and its alloys; plastic films such as polyester or polyolefin; wood; paper; semi-conductor materials (i.e., materials which are not conductive unless and until they are doped) such as silicon, gallium arsenide; ceramics; and textiles. Preferably, the support is a silicon-based wafer.

The photoresist coatings produced by the above described procedure are particularly suitable for application to thermally grown silicon/silicon dioxide-coated wafers such as are utilized in the production of microprocessors and other miniaturized integrated circuit components. The substrate may also comprise various polymeric resins especially transparent polymers such as polyesters. The substrate may also comprise doped silicon dioxide, silicon nitride, tantalum, copper, polysilicon, ceramics and aluminum/copper mixtures.

After the photosensitive composition solution is coated onto the substrate, the substrate is baked at approximately 80° to 100°, until substantially all of the solvent has evaporated and only a thin coating of photoresist composition on the order of a micron in thickness remains on the substrate. The coated substrate can then be exposed to actinic radiation especially ultraviolet radiation in the range of about 250 nm to about 450 nm, produced by use of suitable photomasks, negatives, stencils, templates, projection means, etc. In a more preferred embodiment the u.v. exposure range is from about 254 nm to about 436 nm.

The exposed resist-coated substrates are next immersed in alkaline developing solution, such as potassium based aqueous alkaline solution such as AZ 400K available from Hoechst Celanese Corporation of Somerville, N.J. The solution is preferably metal ion free. In use the developer is agitated, for example, by nitrogen burst agitation. The substrates are allowed to remain in the developer until all, or substantially all, of the resist coating has dissolved from the exposed areas.

After removal of the coated wafers from the developing solution, a post-development heat treatment or bake may be employed to increase the coating's adhesion and chemical resistance to etching solutions and other substances as taught by British Pat. No. 1,154,749. The post-development heat treatment can comprise the oven baking of the coating and substrate below the coating's softening point. In industrial applications, particularly in the manufacture of microcircuitry units on silicon/silicon dioxide-type substrates, the developed substrates may be treated with a buffered, hydrofluoric acid etching solution. The resist compositions of the present invention are resistant to such etching solutions and provide effective protection for the unexposed resist-coated areas of the substrate.

It is known in the art that photosensitive compositions of the above described type are of positive working variety. However, this invention is not so limited and is particularly suitable as a so-called image-reversal photoresist where by suitable other ingredients or processing steps which are known in the art a negative image may be obtained. For example, one may include suitable crosslinking agents in the photosensitive composition. Non-exclusive examples of crosslinking agents and processes are hexamethylol melamine ether as taught in U.S. Pat. Nos. 4,581,321; as well as crosslinking agents and processes taught in U.S. Pat. Nos. 4,104,070; 4,196,003, 4,576,901 and 4,506,006; as well as the dimethylol paracresol and other classes of crosslinkers taught in U.S. Ser. No. 06/895,609 all of which are incorporated herein by reference. The herein claimed substituted hydroxystyrene and acetoxystyrene polymers may be substituted for the alkali soluble binding resins taught in these references. The crosslinking compound is a compound, which when in the presence of that amount and strength of acid generated when the diazide is exposed, is capable of crosslinking the polymer. This occurs upon the application of sufficient heat to diffuse the acid to the crosslinking component but less heat than will decompose the diazide. The generally preferred class of such compounds are those capable of forming a carbonium ion under the foregoing acid and heat conditions. Crosslinkers particularly suitable for use in the present invention non-exclusively include those having the general formula:

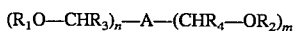

wherein A has the formula B-Y-B wherein B is a substituted or unsubstituted mononuclear or fused polynuclear aromatic hydrocarbon or an oxygen or sulfur containing heterocyclic compound, Y is a single bond, $C_1$–$C_4$-alkylene or alkylenedioxy, the chains of which may be interrupted by oxygen atoms, —O—, —S—, —$SO_2$—, —CO—, —$CO_2$—, —O—$CO_2$—, —CONH—, or phenylenedioxy; $R_1$ and $R_2$ are H, $C_1$–$C_6$-alkyl, cycloalkyl, substituted or unsubstituted aryl, alkaryl or acyl; $R_3$, $R_4$ are independently H, $C_1$–$C_4$ alkyl or substituted or unsubstituted phenyl and n ranges from 1 to 3 and m ranges from 0–3, provided that n+m is greater than 1. The crosslinker would preferably be present in the photographic composition in an amount of from about 0.5% to about 20%, more preferably about 1% to about 10% based on the solid components of the photographic composition. In the most preferred embodiment, when image reversal is desired, a 1,2 naphthoquinone-2-diazide-4-sulfonyl containing isomer is employed as the photosensitizer. The 4-isomer has been found to generate more acid than the corresponding 5-isomer and hence is more desirable for image reversal techniques. In one image reversal mode, the photosensitive composition is coated upon a suitable substrate as hereinabefore described, and is dried until it is non-tacky, for example by heating at approximately 20° to 100° C. for from 30 seconds to about 3 minutes. It is then exposed imaging energy to any desired pattern in a manner well known to the skilled artisan. The resist is then subjected to a post exposure baking of from about 95° C. to about 16° C. or more preferably 112° C. to about 120° C., for from about 10 seconds to the time necessary to crosslink the resin. This may range from about 10 to about 90 seconds. After baking one may perform an optional overall flood exposure. The exposed resist is then developed in a suitable developer until substantially all of the non-image areas of the resist have been removed. Suitable developers non-exclusively include aqueous solutions of sodium hydroxide, and tetramethyl ammonium hydroxide as are well known in the art. The developed resist may optionally be heat treated again.

The following examples are illustrative of the invention and of the benefits of the light-sensitive composition of the invention as compared to homologous light-sensitive compositions, but it is understood that the invention is not limited thereto.

EXAMPLE 1

47 g of 4-acetoxystyrene monomer, 28.2 g of maleic anhydride and 0.75 g azo isobutyronitrile are polymerized in 250 ml of tetrahydrofuran for 24 hours at 70° C. The reaction product is cooled to room temperature and precipitated in 2 l of methanol. The white polymer is filtered and air dried to yield 71 g of poly (4-acetoxystyrene/maleic anhydride). 5 g of poly (4-acetoxystyrene/maleic anhydride), 1.4 g propyl amine and 50 ml N-methyl pyrrolidone is stirred at 75° C. for 1 hour and then at 160° C. for 15 hours. The polymer is isolated by precipitating with 500 ml water and filtering to yield

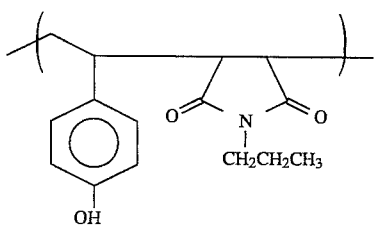

EXAMPLE 2

Example 1 is repeated using 50 g of poly (4-acetoxystyrene/maleic anhydride), 18.8 g cyclohexylamine and 200 g N-methyl pyrrolidone. The reaction proceeds at 75° C. for 1 hour then 150° C. for 24 hours. The following polymer is obtained by precipitating into water:

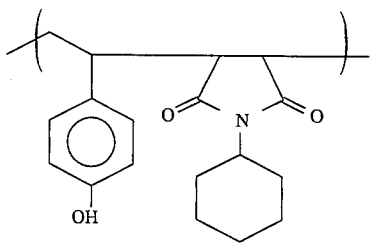

EXAMPLE 3

A photoresist is made up of a solution containing 10% of solids of 2,3,4-trihydroxy-3'-methyl benzophenone 1,2-naphthaquinone-2-diazide-4-sulfonic acid triester and 90% of solids of the resin produced according to example 1 in sufficient propylene glycol monomethyl ether acetate to form a homogeneous solution. Using this formulation, silicon wafers are coated at 4,000 rpm and then soft-baked in a vented convection oven at 90° C. for 30 minutes. Actinic exposure is applied using the Perkin Elmer 220 Micralign aligner through a glass photomask containing a resolution test pattern. Using aperature #4, the scan speeds are varied between 200 and 400 arbitrary energy units. These different scan speeds (each scan speed represents a different experiment) corresponds to between 20 and 10 $mJ/cm^2$ respectively as determined by a radiometer for wave lengths between 365 and 436 nm. The photomask consists of a resolution test pattern where single line and equal line and spaces are represented. The width of these features varies between 1.0 and 3.0 um in 0.25 um increments. After exposure the wafers are optionally hard baked sequentially on a MTI Inc. hot plate at temperatures ranging from 110° C. to 150° C. for up to 60 seconds. A relief image is not observable when the wafers are placed under an optical microscope with monochromatic 520 nm illumination.

After developing the exposed and optionally hard baked wafers in AZ 433 MIF Developer (available from AZ Photoresists Group of Hoechst Celanese Corporation, Somerville, N.J. as a 0.33N solution of tetramethylammonium hydroxide) in an immersion mode process for 3 minutes with slight agitation, the wafers are DI water rinsed and spin dried. If the wafers are now examined using a scanning electron microscope at 10,000 magnification, 1 um single space and larger geometries are clearly seen to be completely opened.

What is claimed is:

1. A process for forming a negative photographic image which comprises coating a photographic composition on a support, which photosensitive composition comprises in admixture an alternating copolymer having the structure

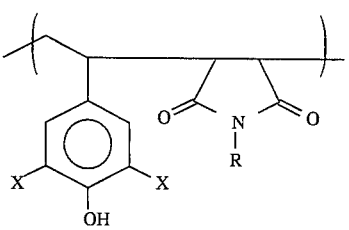

wherein X is independently H, $C_1$ to $C_{10}$ alkyl or alkoxy, primary or secondary amino or halogen, and R consists of a group which is aliphatic, cycloaliphatic, or aliphatic heterocyclic, and wherein the molecular weight ranges from about 1,000 to 50,000; and an o-quinone diazide photosensitizer, a crosslinking agent and a solvent; wherein said copolymer is present in sufficient amount to serve as a binder for the composition, and said diazide and crosslinking agent are present in sufficient amount to provide image differentiation when the composition is coated on a substrate and imagewise exposed to actinic radiation; and said solvent is present in sufficient amount to form a homogeneous solution of the composition components; drying the composition until it is substantially non-tacky; imagewise exposing the composition to sufficient actinic, electron beam or x-ray radiation to provide an imagewise differentiation; crosslinking said copolymer; and removing the imagewise non-exposed portions of said composition with a developer.

2. A process for forming a negative photographic image which comprises coating a photographic composition on a support, which photosensitive composition comprises in admixture an alternating copolymer having the structure

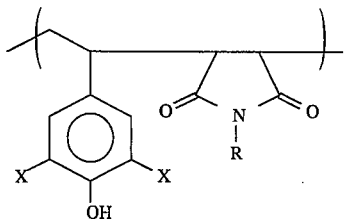

wherein X is independently H, $C_1$ to $C_{10}$ alkyl or alkoxy, primary or secondary amino or halogen, and R consists of a group which is aliphatic, cycloaliphatic, or aliphatic heterocyclic, and wherein the molecular weight ranges from about 1,000 to 50,000; and an o-quinone diazide photosensitizer, a crosslinking agent and a solvent; wherein said copolymer is present in sufficient amount to serve as a binder for the composition, and said diazide and crosslinking agent are present in sufficient amount to provide image differentiation when the composition is coated on a substrate and imagewise exposed to actinic radiation; and said solvent is present in sufficient amount to form a homogeneous solution of the composition components; drying the composition until it is substantially non-tacky; imagewise exposing the composition to sufficient actinic, electron beam or x-ray radiation to provide an imagewise differentiation; heating the composition at a temperature of from about 95° C. to about 160° C. to crosslink the copolymer and removing the non-image portions of said composition with a developer.

3. The process of claim 1 wherein said developer comprises an aqueous alkaline solution.

4. The process of claim 3 wherein said developer is metal ion free.

* * * * *